(12) United States Patent
Wilson

(10) Patent No.: US 6,603,704 B2
(45) Date of Patent: Aug. 5, 2003

(54) REDUCED CURRENT ADDRESS SELECTION CIRCUIT AND METHOD

(75) Inventor: Alan J. Wilson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/965,209

(22) Filed: Sep. 26, 2001

(65) Prior Publication Data

US 2003/0058724 A1 Mar. 27, 2003

(51) Int. Cl.[7] .................................................. G11C 8/00
(52) U.S. Cl. .......................... 365/230.08; 365/230.02; 365/222
(58) Field of Search ..................... 365/230.05, 230.09, 365/230.02, 222, 230.08

(56) References Cited

U.S. PATENT DOCUMENTS

| 4,800,531 A | * | 1/1989 | Dehganpour et al. | ....... 365/222 |
| 5,488,587 A | * | 1/1996 | Fukumoto | ................... 365/222 |

* cited by examiner

*Primary Examiner*—Richard Elms
*Assistant Examiner*—Jung H. Hur
(74) *Attorney, Agent, or Firm*—Dorsey & Whitney LLP

(57) ABSTRACT

An address selection circuit and method selects an internal address from a plurality of input address signals and avoids unnecessary signal transitions to reduce current consumption. A latch coupled to the outputs of first and second transfer gates latches either the first or second of the respective input address signals as the internal address and maintains the logic level of the input address signal even after enable signals for each of the transfer gates becomes inactive to prevent unnecessary transitions in the internal address.

42 Claims, 6 Drawing Sheets

REDUCED CURRENT ADDRESS SELECTION CIRCUIT AND METHOD

TECHNICAL FIELD

The present invention relates to memory devices, and more particularly to address selection circuitry having lower current consumption during an internal address selection operation.

BACKGROUND OF THE INVENTION

Dynamic Random Access Memories ("DRAMs") are commonly used in a variety of electronic devices, such as computers. A high level block diagram of a typical DRAM is shown in FIG. 1. The DRAM shown in FIG. 1 is a synchronous dynamic random access memory ("SDRAM") 100, although the principles described herein are applicable to any memory device having a need for internal address selection circuitry. The SDRAM 100 includes an address register 104 that receives row addresses and column addresses on a multiplexed address bus. The address bus is generally coupled to a memory controller (not shown) which provides the row and column addresses.

Typically, a row address is initially received by the address register 104 and applied to a row address multiplexer 108. The row address multiplexer 108 couples the row address to a number of components associated with memory banks 130a–d, depending upon the state of a bank address bit forming part of the row address. Associated with each of the memory banks 130a–d is a respective row address latch/decoder 120a–d which stores the row address and applies various signals to its respective array 130a–d as a function of the stored row address. The row address multiplexer 108 also couples row addresses to the row address latches 120a–d for the purpose of refreshing the memory cells in the arrays 130a–d. The row addresses are generated for refresh purposes by a refresh counter 110. As will be described in greater detail below, the row address multiplexer 108 includes address selection circuitry 109 that selects between providing the external address received from the address register 104 and the address received from the refresh counter 110 to the row address latch/decoder 120a–d as an internal address.

After the row address has been applied to the address register 104 and stored in one of the row address latches/decoder 120a–d, a column address is applied to the address register 104. The address register 104 couples the column address to a column address latch 112 where the address is stored. Column decoders 124a–d receive the column addresses from the column address latch 112, and apply various signals to associated column circuitry 128 and respective sense amplifiers for the respective arrays 130a–d. Data to be read from the arrays 130a–d are coupled to the column circuitry 128 and subsequently coupled to a data output register 142, which applies the data to a data bus 150. Data to be written to one of the arrays 130a–d are coupled from the data bus 150 through a data input register 154 to the column circuitry 128, where the data are transferred to the arrays 130a–d.

The above-described operation of the SDRAM 100 is controlled by control logic 102 responsive to high level command signals received on a control bus. These high level command signals, which are typically generated by a memory controller (not shown), often include a clock enable signal CKE*, a clock signal CLK, a chip select signal CS*, a write enable signal WE*, a row address strobe signal RAS*, and a column address strobe signal CAS*, where the "*" designates the signal as active low. The control logic 102 generates a sequence of command signals responsive to the high level command signals to carry out various memory functions and program memory modes designated by each of the high level command signals, such as memory read, memory write, refresh operations, standby mode, and the like. For example, driving the RAS* and CAS* inputs low with CKE* high will cause the SDRAM 100 to enter a self-refresh mode. In the self-refresh mode, the control logic 102 causes the memory cells corresponding to the address provided by the refresh counter 110 in the arrays 120a–d to be periodically refreshed. These command signals, and the manner in which they accomplish their respective functions, are conventional. Therefore, in the interest of brevity, a further explanation of these control signals will be omitted.

As mentioned previously, in the memory device 100, the row address multiplexer 108 is commanded by the control logic 102 to provide as an internal row address to the row address latches/decoders 120a–d either an external address latched by the address register 104 or a CBR address provided by the refresh counter 110. Where the memory device 100 is operating in a normal mode, the row address multiplexer 108 provides the external address to the row address latches/decoders 120a–d for accessing the corresponding row of the memory arrays 120a–d. The CBR addresses, on the other hand, are provided by the refresh counter 110 to the row address latches/decoders 120a–d to facilitate auto-refresh and self-refresh operations, which are well known in the art.

FIG. 2 illustrates a known design of an address selector 200 that is included in the address selection circuitry 109. As illustrated in FIG. 2, the address selector 200 provides one bit of the row address that is provided to the row address latches/decoders 120a–d. Thus, the address selection circuitry 109 typically includes multiple address selectors 200 to provide appropriate number of bits of the row address to the row address latches/decoders 120a–d. The multiple address selectors 200 operate identically, and consequently, the description of the address selector 200 provided herein is applicable to the other address selectors as well.

The address selector 200 provides either the external address or the CBR address as the internal address to the row address latch/decoder 120 based on the row address activation signal ARA. Specifically, where the ARA signal is HIGH, the external address is provided, and where the ARA signal is LOW, the CBR address is provided instead. The generation of the ARA signal is typically performed by circuitry (not shown) under the command of the control logic 102 and in response to the mode of operation of the memory device 100.

As is commonly known in the art, the address bus of the memory device 100 is multiplexed between row and column addresses, consequently, the ARA signal is strobed to latch the row address before the column address becomes valid. Thus, after the external row address is latched by the row address latches/decoders 120a–d, the ARA signal returns to an inactive state, the multiplexer 202 switches to providing the CBR address as the internal address. In essence, the row address multiplexer 108 provides the CBR address to the row address latches/decoder 120a–d as a default when the ARA signal is not active.

It is generally accepted that it is more desirable to have lower power consuming devices, including in particular, memory devices. To this end, circuits included in devices have been designed to be more power efficient. From this perspective, the address selector 200 may not be a desirable alternative because its design includes inherent power inefficiencies.

An example of such inefficiencies will be discussed with respect to FIG. 3. As previously discussed, the address selector 200 provides the CBR address to the row address latches/decoders 120a–d as a default, or more specifically, when the ARA signal returns to an inactive state after latching an external row address. As shown in FIG. 3, at a time T0 a memory array access operation is initiated by activating a bank and row of memory. The ARA signal becomes active to set the multiplexer 202 (FIG. 2) to provide the clocked external row address as the internal address for activation of the row corresponding thereto. At a time T1, when the ARA signal becomes inactive after latching the external row address, the multiplexer is set to the default state and provides the CBR address to the row address latches/decoders. At a time T2, the ARA signal becomes active again to latch an external row address corresponding to the row of memory that is to be deactivated, thus, completing the memory array access operation. Consequently, the multiplexer 202 is again set to provide the external address to the row address latches/decoders 120a–d. When the ARA signal again becomes inactive at a time T3 following the latching of the external row address, the multiplexer 202 switches back to the default state of providing the CBR address as the internal address.

The power inefficiencies related to the address selector 200 result from the multiple transitions of the internal address that occur each time the ARA signal returns to an inactive state. It is well known that with CMOS circuitry, which is generally extensively incorporated in the design of integrated circuits, such as memory device 100 of FIG. 1, current is consumed or dissipated when transitions from one logic state to another occur. Where multiple circuits are involved, such as in the address selection circuitry of the row address multiplexer 108, buffer circuitry driving the internal address bus, and latch and decoder circuitry of the row address latches/decoders 120a–d, the cumulative current consumption during a logic transition may be significant. Thus, minimizing the number of unnecessary transitions the circuitry must make will generally reduce power consumption.

As illustrated in FIG. 3, the ARA signal is typically strobed twice in a memory access cycle, resulting in four transitions of the internal address. As mentioned previously, the transitions occurring at the times T1 and T3 merely result from the address selector 200 returning to the default state of providing the CBR address as the internal address, although the CBR address is not used during the memory access operation. Consequently, the transitions at the times T1 and T3 cause the address circuitry involved to unnecessarily consume current. In the worst case, the external row address latched while the ARA signal is strobed and the CBR address are complementary, causing all bits of the internal address to transition. Moreover, the current consumption of the memory device 100 having address selection circuitry 109 that includes the address selection circuit 200 becomes unpredictable because the quantity of current consumed as a result of transitions of the internal address is related to the particular external address latched and the particular CBR address provided by the refresh counter 110. As this changes frequently, it becomes difficult to accurately predict the power consumption of the memory device 100.

SUMMARY OF THE INVENTION

The present invention is directed to an address selection circuit and method that reduces current consumption by avoiding unnecessary transitions in an internal address signal. The address selection circuit includes a first transfer gate having an input to which a first address signal is applied and an output to which the input is coupled in response to an active first control signal applied to a control terminal of the first transfer gate. The address selection circuit further includes a second transfer gate having an input to which a second address signal is applied and an output to which the input is coupled in response to an active second control signal applied to a control terminal of the second transfer gate. A latch coupled to the outputs of the first and second transfer gates is also included in the address selection circuit to latch the either the first or second of the input address signals as the internal address. The latch maintains the logic level thereof even after the enable signal becomes inactive.

DETAILED DESCRIPTION OF THE INVENTION

Embodiments of the present invention are directed to a method and apparatus for selecting an internal address having reduced current consumption. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 4:
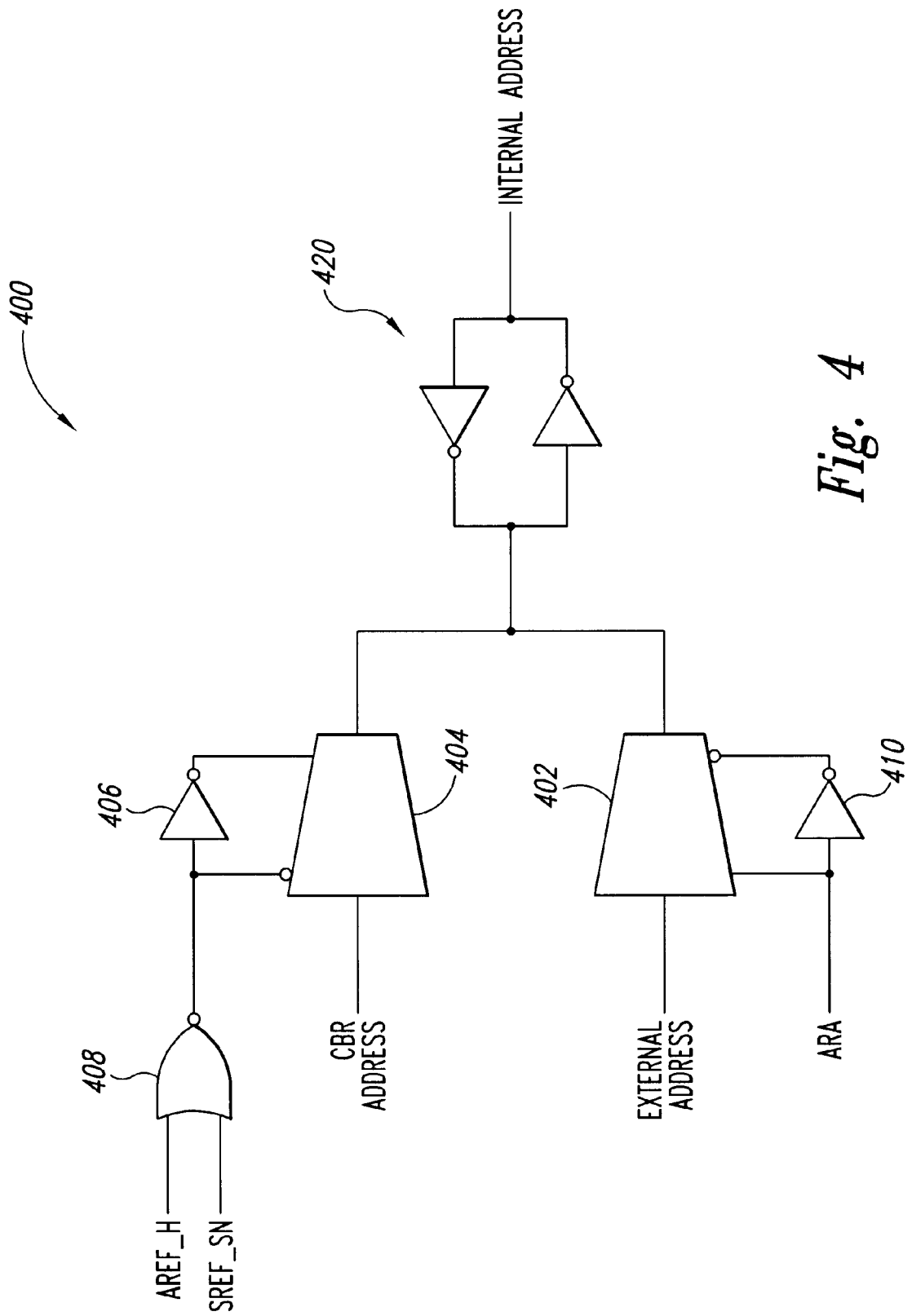
FIG. 4 is a schematic drawing of an address selection circuit according to an embodiment of the present invention.

FIG. 4 illustrates an address selection circuit 400 according to an embodiment of the present invention. The address selection circuit 400 includes a transfer gate 402 having an input to which one bit of the external address is applied and an output coupled to a latch circuit 420. The transfer gate 402 couples the external address applied to the latch circuit 420 in response to a HIGH ARA signal. A transfer gate 404 is also included in the address selection circuit 400. The transfer gate 404 has an input to which one bit of the CBR address is applied and an output coupled to the latch circuit 420. The output of a two-input NOR gate is coupled to the control terminals of the transfer gate 404. Thus, the transfer gate 404 couples the CBR address applied to its input to the latch circuit 420 in response to either an auto-refresh command signal AREF_H or a self-refresh command signal SREF_EN having a HIGH logic level.

Figure 3:
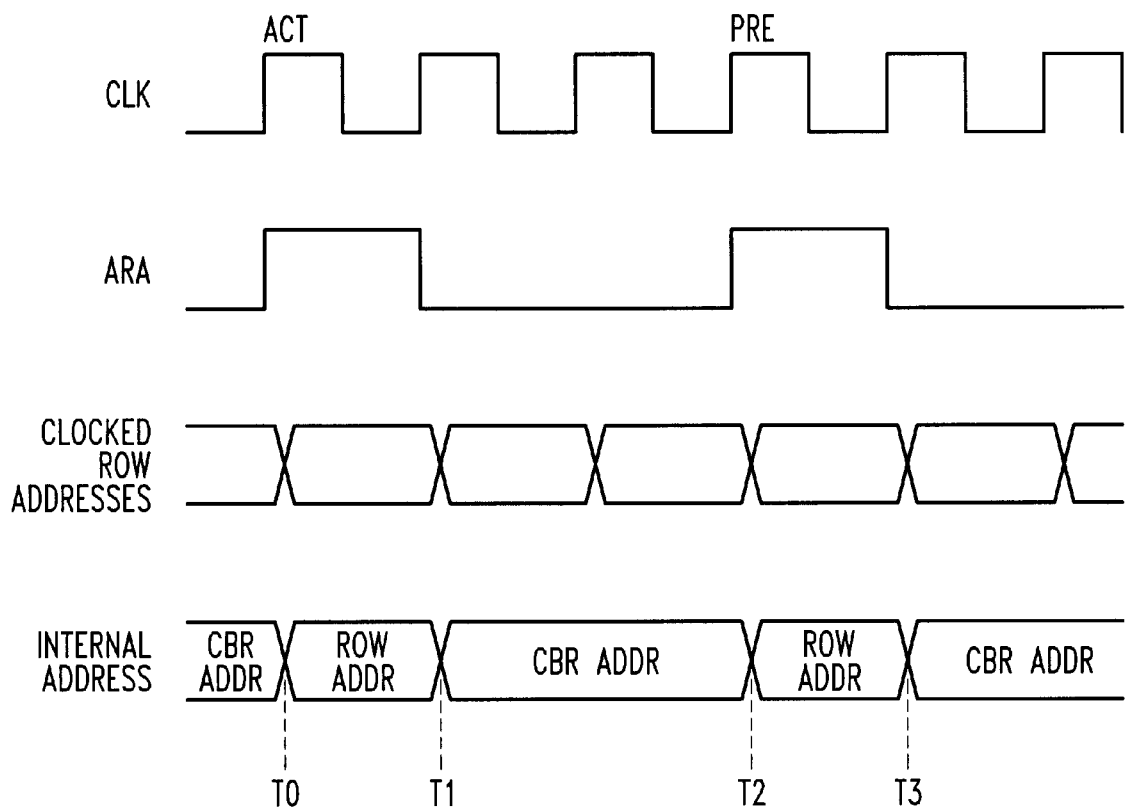
FIG. 3 is a timing diagram of various signals related to the address selection circuit of FIG. 2.
Figure 5:
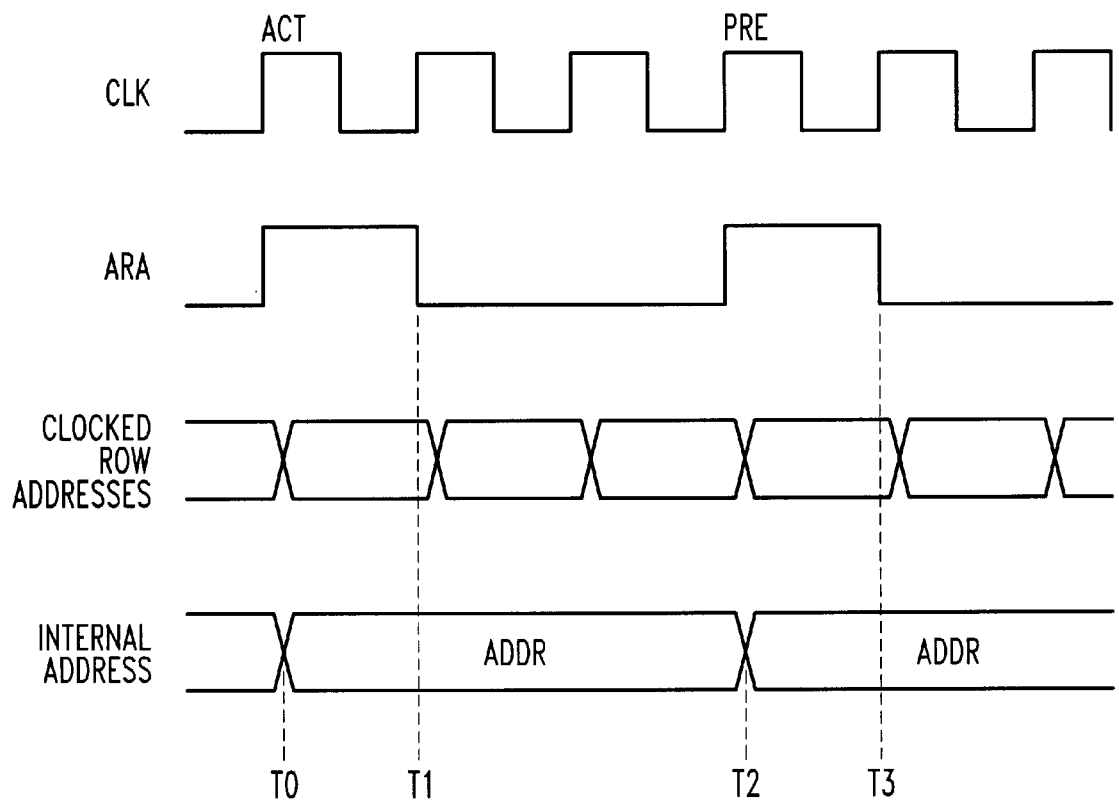
FIG. 5 is a timing diagram of various signals related to the address selection circuit of FIG. 4.

The operation of the address selection circuit 400 will be explained with respect to the timing diagram illustrated in FIG. 5. As previously discussed with respect to the timing diagram of FIG. 3, the ARA signal is strobed twice during a memory access operation. As illustrated in FIG. 5, the ARA signal is active a first time between times T0 and T1 to latch a row address corresponding to the row of memory that will be activated during the memory access operation. The ARA signal is active a second time between times T2 and T3 to latch the row address of the row of memory to be deactivated to complete the memory array access operation.

Figure 1:
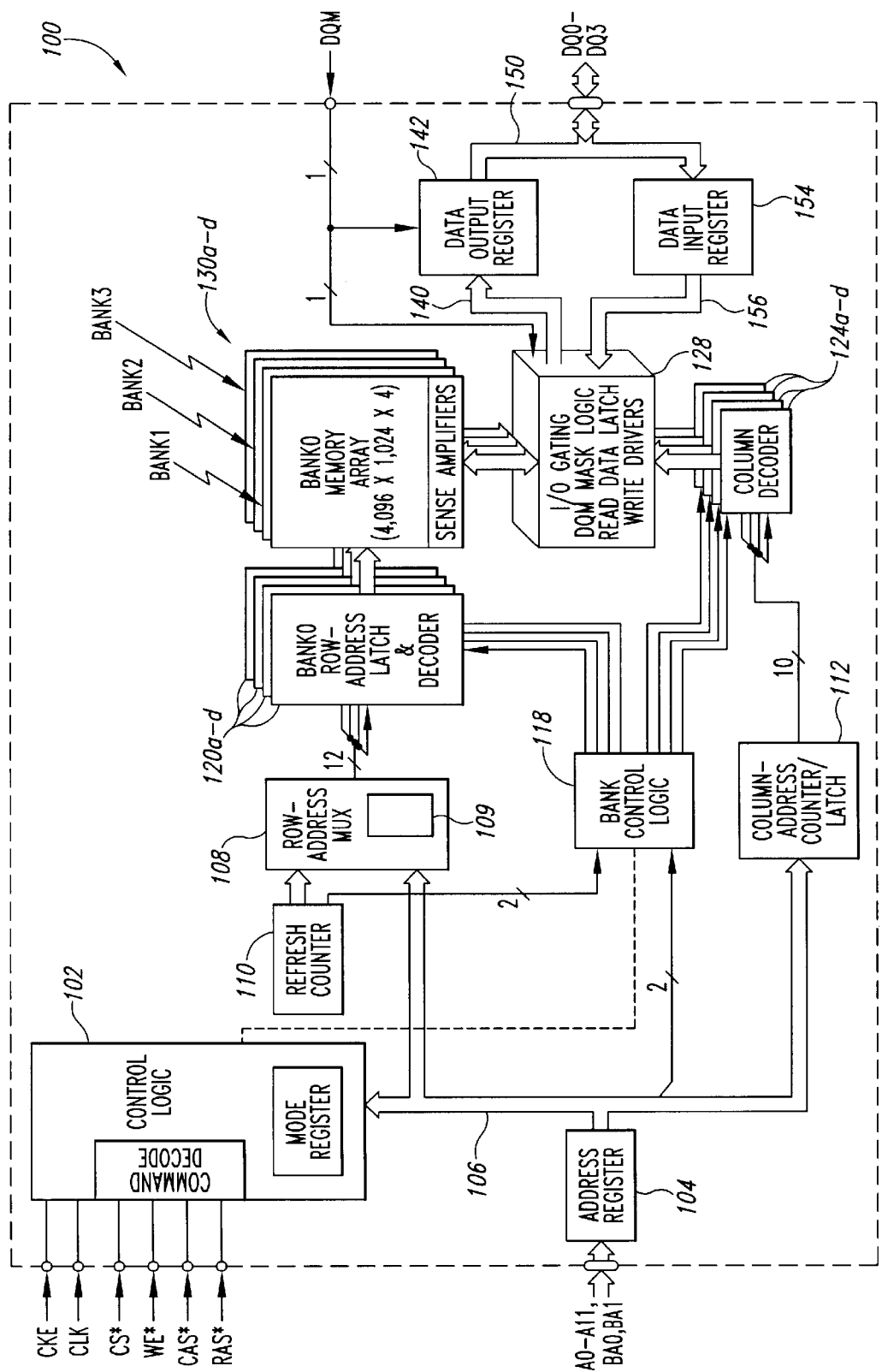
FIG. 1 is a block diagram of a conventional memory device.
Figure 2:
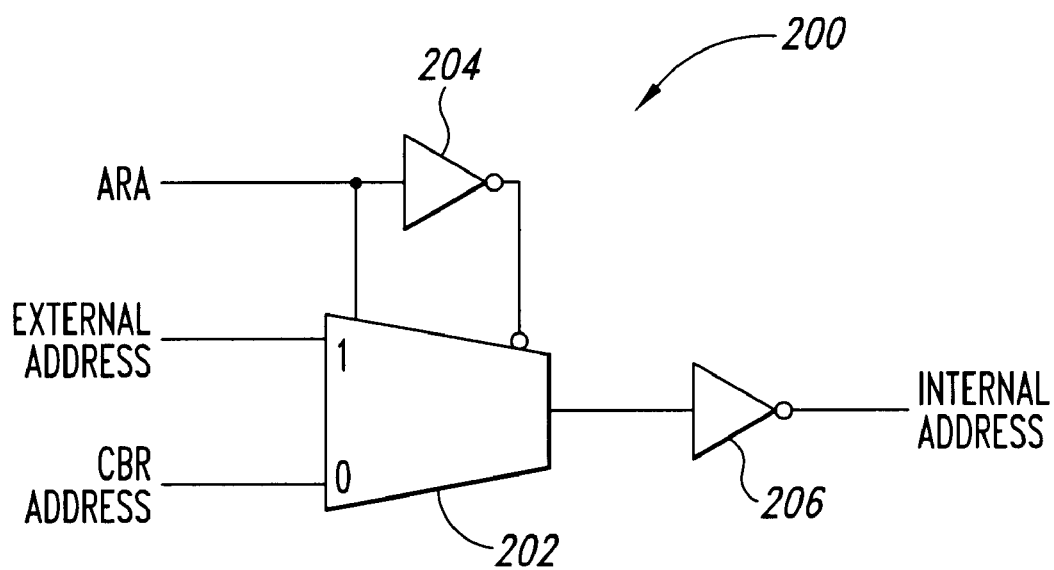
FIG. 2 is a schematic drawing of an address selection circuit.

In response to the ARA signal becoming HIGH at the time T0, the transfer gate 402 couples the external address applied to its input to the latch circuit 420 to be stored. As the ARA signal transitions LOW, the transfer gate 402 merely decouples the external address from the latch circuit 420. However, because the external address is latched while the ARA signal is active, the latched external address remains valid until either transfer gates 402 or 404 couple a new row address to the latch circuit 420. Consequently, the internal address provided by the address selection circuit 400 does not transition upon the. ARA signal returning LOW, unlike the conventional address selection circuit 200 (FIG. 2). The internal address transitions a second time when the ARA signal strobes for the second time at the time T2. Again, as with the first time the ARA signal is strobed, the external address is latched by the latch circuit 420 when the transfer gate 402 is activated by the ARA signal and remains valid after the ARA signal returns to a LOW logic level at a time T3.

Where the auto-refresh or self-refresh mode is enabled, an active auto-refresh command signal AREF_H or self-refresh command signal SREF_EN is generated and provided to the NOR gate 408. Either an active AREF_H or SREF_EN signal will enable the transfer gate 404 to couple the CBR address to the latch circuit 420 for provision to the row address latches/decoders as the internal address. After an auto-refresh command is issued and subsequently becomes inactive, the CBR address remains latched until a new address is provided to the latch circuit 420. In a self-refresh mode, the multiplexer can be made to remain on for the duration, or clocked as the other signals, depending on the state of the self-refresh mode enable signal SREF_EN. It will be appreciated that those of ordinary skill in the art will have a sufficient understanding of the present to generate the ARA signal and the AREF_H and SREF_EN signals in a coordinated fashion such that only one of the transfer gates 402 and 404 are active at a given time to avoid address contention.

Comparing the timing diagram of FIG. 4 for the address selection circuit 400 and the timing diagram of FIG. 2 for the conventional address selection circuit 200, it is apparent that the unnecessary transitions of the internal address that occurred at times T1 and T3 for the conventional address selection circuit 200 are avoided by the address selection circuit 400. Consequently, the current consumption of the address selection circuit 400 is less than that of the conventional address selection circuit 200.

In summary, embodiments of the present invention avoid the unwanted transitions in the internal address by neither providing the CBR address or the external address as a default. Instead, embodiments of the present invention select whether to provide the CBR address or external address through a command signal, and subsequently latching the address that is to be provided as the internal address. The ARA signal continues to be the external row address selection signal, which allows the external address to be latched. However, when the ARA signal becomes inactive, the internal address signal remains valid until receiving a subsequent active ARA signal, or an auto-refresh or self refresh enable signal, which couples the CBR address to the latch circuit.

Figure 6:
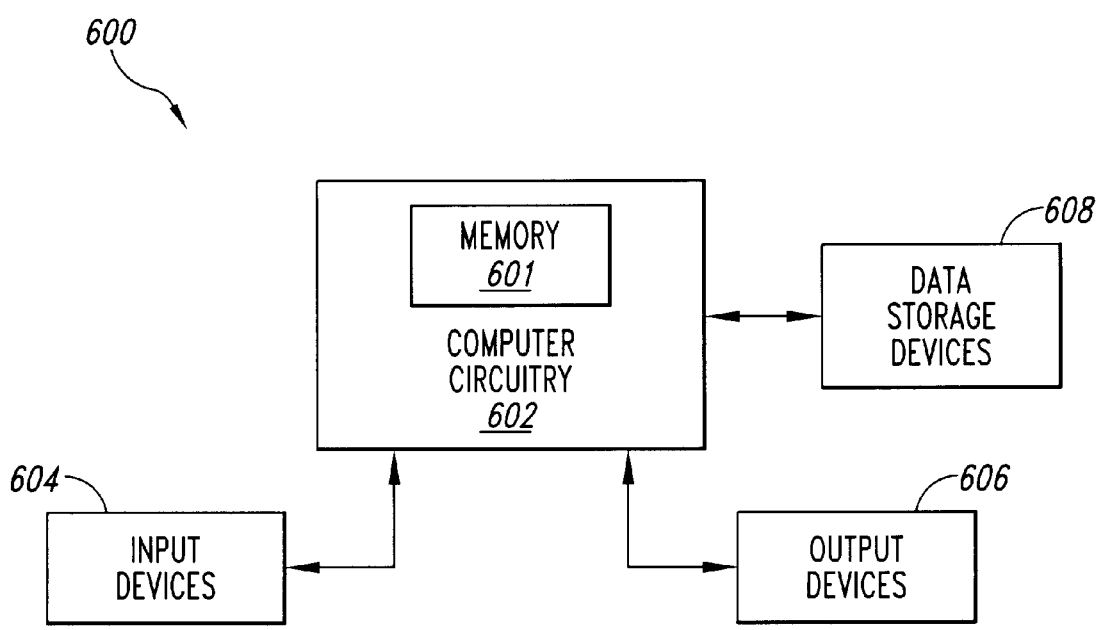
FIG. 6 is a block diagram of a computer system having a memory device including address selection circuitry according to an embodiment of the present invention.

FIG. 6 is a block diagram of a computer system 600 including computing circuitry 602. The computing circuitry 602 contains a memory 601, that can be a volatile memory, such as a DRAM, or a non-volatile memory, such as a FLASH memory. The computing circuitry 602 could also contain both a DRAM and FLASH memory. The memory 601 includes charge pump circuitry having oscillator circuitry according to embodiments of the present invention. The computing circuitry 602 performs various computing functions, such as executing specific software to perform specific calculations or tasks. In addition, the computer system 600 includes one or more input devices 604, such as a keyboard or a mouse, coupled to the computer circuitry 602 to allow an operator to interface with the computer system. Typically, the computer system 600 also includes one or more output devices 606 coupled to the computer circuitry 602, such output devices typically being a printer or a video terminal. One or more data storage devices 608 are also typically coupled to the computer circuitry 602 to store data or retrieve data from external storage media (not shown). Examples of typical storage devices 608 include hard and floppy disks, tape cassettes, and compact disc read-only memories (CD-ROMs). The computer circuitry 602 is typically coupled to the memory device 601 through appropriate address, data, and control busses to provide for writing data to and reading data from the memory device.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An address selection circuit coupled to an address latch and decoder circuit, comprising:
    a first transfer gate having an input to which a first address signal is applied and an output to which the input is coupled in response to an active first control signal applied to a control terminal of the first transfer gate;
    a second transfer gate having an input to which a second address signal is applied and an output to which the input is coupled in response to an active second control signal applied to a control terminal of the second transfer gate; and
    a latch circuit coupled to the output of the first and second transfer gates and to an input of the address latch and decoder circuit to latch a logic level of either the first or second address signals for use as an internal address signal and maintain the logic level of the latched signal at the input of the address latch and decoder circuit after the address latch and decoder circuit has latched the internal address signal and the first or second control signal is inactive.

2. The address selection circuit of claim 1 wherein the latch circuit comprises first and second inverters, each inverter having an output coupled to the input of the other inverter.

3. The address selection circuit of claim 1, further comprising a two-input NOR gate having an output coupled to the control terminal of the first transfer gate to provide the first control signal.

4. The address selection circuit of claim 1 wherein address selection circuit is included in a memory device, the first address signal comprises an address signal based on an address generated in the memory device internally and the second address signal comprises an address signal based on an address provided to the memory device externally.

5. The address selection circuit of claim 1 wherein the first and second control signals are strobed to temporarily couple the respective address signal to the latch circuit.

6. An address selection circuit for selecting an internal address from a plurality of input address signals and providing the internal address to an address latch and decoder circuit, comprising:
- a first switch having an input to which a first of the input address signals is applied, and further having an output and control terminals, in a first mode, the first switch coupling the input to the output in response to an active enable signal applied to the control terminals;
- a second switch having an input to which a second of the input address signals is applied, and further having an output and control terminals, in a second mode, the second switch coupling the second of the input addresses to the output in response to an active mode signal applied to the control terminals; and
- a latch coupled to the output of the first and second switches and an input of the address latch and decoder circuit for latching a logic level of either the first or second of the input address signals as the internal address and maintaining the logic level thereof at the input of the address latch and decoder circuit after the address latch and decoder circuit has latched the internal address and the enable signal becomes inactive.

7. The address selection circuit of claim 6 wherein the first and second switches comprise transfer gates.

8. The address selection circuit of claim 6 wherein the latch comprises first and second inverters, each inverter having an output coupled to the input of the other inverter.

9. The address selection circuit of claim 6 wherein the second mode is a refresh mode.

10. The address selection circuit of claim 9, further comprising a two-input NOR gate having an output coupled to the control terminals of the second switch, a first input of the NOR gate having a first refresh signal applied thereto and a second input of the NOR gate having a second refresh signal applied thereto.

11. The address selection circuit of claim 6 wherein the first and second switches decouple the respective inputs from the outputs in response to the signal applied to the respective control terminals becoming inactive.

12. An address selection circuit for selecting an internal address signal from a plurality of input address signals and providing the internal address signal to an address latch and decoder circuit, the address selection circuit coupling an input address signal based on an address internally generated by the memory device to a node in response to an active refresh command, coupling an input address signal based on an externally generated address to the node in response to an active enable signal, latching as the internal address signal a logic level of the input address signal of either the internally generated address or the externally generated address when the respective input address signal is coupled to the node, and maintaining the logic level of the internal address signal at the node after the address latch and decoder circuit has latched internal address signal and the refresh command or enable signal becomes inactive.

13. The address selection circuit of claim 12 wherein the internally generated address represents an address of a row in a memory array to be refreshed.

14. The address selection circuit of claim 12 wherein the externally generated address represents an address of a row in a memory to be accessed.

15. The address selection circuit of claim 12 wherein the address selection circuit further generates an active refresh command in response to activation of either an auto-refresh command or a self-refresh command.

16. The address selection circuit of claim 12 wherein the address selection circuit further decouples the address signal based on the externally generated address from the node in response to the enable signal becoming inactive.

17. A memory device, comprising:
- a data bus;
- a read/write circuit coupled to the data bus;
- a memory-cell array coupled to the read/write circuit;
- an address latch and decoder coupled to the memory-cell array;
- an address bus;
- a refresh counter for providing a refresh address; and
- an address multiplexer coupled to the address latch and decoder having at least one address selection circuit coupled to the address bus and the refresh counter to receive input address signals from which an internal address is selected and provided to the address latch and decoder, the address selection circuit, comprising:
  - a first switch having an input coupled to the address bus to receive a first of the input address signals, and further having an output and control terminals, in a first mode, the first switch coupling the input to the output in response to an active enable signal applied to the control terminals;
  - a second switch having an input coupled to the refresh counter to receive a second of the input address signals, and further having an output and control terminals, in a second mode, the second switch coupling the second of the input addresses to the output in response to an active mode signal applied to the control terminals; and
  - a latch coupled to the output of the first and second switches and an input of the address latch and decoder for latching a logic level of either the first or second of the input address signals as the internal address and maintaining the logic level thereof at the input of the address latch and decoder after the address latch and decoder has latched the internal address and the enable signal becomes inactive.

18. The memory device of claim 17 wherein the first and second switches of the address selection circuit comprise transfer gates.

19. The memory device of claim 17 wherein the latch of the address selection circuit comprises first and second inverters, each inverter having an output coupled to the input of the other inverter.

20. The memory device of claim 17 wherein the second mode is a refresh mode.

21. The memory device of claim 20 wherein the address selection circuit further comprises a two-input NOR gate having an output coupled to the control terminals of the second switch, a first input of the NOR gate having a first refresh signal applied thereto and a second input of the NOR gate having a second refresh signal applied thereto.

22. The memory device of claim 17 wherein the first and second switches of the address selection circuit decouple the respective inputs from the outputs in response to the signal applied to the respective control terminals becoming inactive.

23. A computer system, comprising:
- a data input device;
- a data output device;
- a processor coupled to the data input and output devices; and
- a memory device, comprising:
  - a data bus;
  - a read/write circuit coupled to the data bus;

a memory-cell array coupled to the read/write circuit;
an address latch and decoder coupled to the memory-cell array;
an address bus;
a refresh counter for providing a refresh address; and
an address multiplexer coupled to the address latch and decoder having at least one address selection circuit coupled to the address bus and the refresh counter to receive input address signals from which an internal address is selected and provided to the address latch and decoder, the address selection circuit, comprising:
   a first switch having an input coupled to the address bus to receive a first of the input address signals, and further having an output and control terminals, in a first mode, the first switch coupling the input to the output in response to an active enable signal applied to the control terminals;
   a second switch having an input coupled to the refresh counter to receive a second of the input address signals, and further having an output and control terminals, in a second mode, the second switch coupling the second of the input addresses to the output in response to an active mode signal applied to the control terminals; and
   a latch coupled to the output of the first and second switches and an input of the address latch and decoder circuit for latching a logic level of either the first or second of the input address signals as the internal address and maintaining the logic level thereof at the input of the address latch and decoder circuit after the address latch and decoder has latched the internal address and the enable signal becomes inactive.

24. The computer system of claim 23 wherein the first and second switches of the address selection circuit comprise transfer gates.

25. The computer system of claim 23 wherein the latch of the address selection circuit comprises first and second inverters; each inverter having an output coupled to the input of the other inverter.

26. The computer system of claim 23 wherein the second mode is a refresh mode.

27. The computer system of claim 26 wherein the address selection circuit further comprises a two-input NOR gate having an output coupled to the control terminals of the second switch, a first input of the NOR gate having a first refresh signal applied thereto and a second input of the NOR gate having a second refresh signal applied thereto.

28. The computer system of claim 23 wherein the first and second switches of the address selection circuit decouple the respective inputs from the outputs in response to the signal applied to the respective control terminals becoming inactive.

29. A method for selecting from a plurality of input address signals an internal address signal, the method comprising:
   coupling a first of the input address signals to a node;
   latching the logic state of the first of the input address signals from the node;
   latching the latched logic state by an address latch and decoder circuit;
   decoupling the node from any of the input address signals; and
   maintaining the logic state of the first of the input address signals at the node after the address latch and decoder circuit has latched the logic state of the input address signals and the first of the input address signals is decoupled from the node.

30. The method of claim 29 wherein the first of the input address signals is coupled to the node in a first mode, and further comprising coupling a second of the input address signals to the node in a second mode.

31. The method of claim 30 wherein the first of the input address signals represents an address of a row in a memory to be accessed and the second of the input address signals represents an address of a row in a memory array to be refreshed.

32. The method of claim 30, wherein the first of the input address signals is based on an externally generated address representing an address of a row in a memory to be accessed and the second of the input address signals is based on an internally generated address representing an address of a row in a memory array to be refreshed.

33. The method of claim 29, further comprising generating an activation signal having a rising edge at which the coupling is performed and a falling edge at which the decoupling is performed.

34. A method for selecting an internal address signal in a memory device, comprising:
   coupling an address signal based on an address internally generated by the memory device to a node in response to an active refresh command;
   coupling an address signal based on an externally generated address to the node in response to an active enable signal;
   latching the address signal as the internal address signal by an address latch and decoder circuit; and
   maintaining the logic level of the address signal coupled to the node after the address latch and decoder circuit has latched the logic level of the address signal and the refresh command or enable signal becomes inactive.

35. The method of claim 34 wherein maintaining the logic level of the address signal comprises latching as the internal address signal the address signal of either the internally generated address or the externally generated address when the respective address signal is coupled to the node.

36. The method of claim 34 wherein the internally generated address represents an address of a row in a memory array to be refreshed.

37. The method of claim 34 wherein the externally generated address represents an address of a row in a memory to be accessed.

38. The method of claim 34, further comprising generating an active refresh command in response to activation of either an auto-refresh command or a self-refresh command.

39. The method of claim 34, further comprising decoupling the address signal based on the externally generated address from the node in response to the enable signal becoming inactive.

40. A method for selecting an internal address signal in a memory device, comprising:
   coupling a first row address signal to a node in response to an active refresh command and decoupling from the node in response to the refresh command becoming inactive;
   coupling a second row address signal to the node in response to an active enable signal and decoupling from the node in response to the enable signal becoming inactive;
   latching the coupled address signal by an address latch and decoder circuit; and maintaining the logic level of the address signal coupled to the node after the address latch and decoder circuit has latched the coupled address and the first and second address signals are decoupled from the node.

41. The method of claim 40, further comprising latching the logic level of the address signal in response to either the first or second address signal being coupled to the node.

42. The method of claim 40 wherein the first row address signal is based on an address generated in the memory device internally and the second row address signal is based on an address generated external to the memory device.

* * * * *